(12) United States Patent
Chung

(10) Patent No.: US 12,387,792 B2
(45) Date of Patent: Aug. 12, 2025

(54) MEMORY DEVICE AND OPERATING METHOD THEREOF

(71) Applicant: Taiwan Semiconductor Memory INC., Hsinchu (TW)

(72) Inventor: Steve S. Chung, Hsinchu (TW)

(73) Assignee: TAIWAN SEMICONDUCTOR MEMORY INC., Hsinchu (TW)

( * ) Notice: Subject to any disclaimer, the term of this patent is extended or adjusted under 35 U.S.C. 154(b) by 263 days.

(21) Appl. No.: 18/190,577

(22) Filed: Mar. 27, 2023

(65) Prior Publication Data
US 2023/0335197 A1    Oct. 19, 2023

(30) Foreign Application Priority Data

Apr. 15, 2022    (TW) .................................. 111114499

(51) Int. Cl.
*G11C 16/10*    (2006.01)
*G11C 16/04*    (2006.01)
*G11C 16/08*    (2006.01)

(52) U.S. Cl.
CPC ........ *G11C 16/102* (2013.01); *G11C 16/0433* (2013.01); *G11C 16/08* (2013.01)

(58) Field of Classification Search
CPC .............. G11C 16/102; G11C 16/0433; G11C 16/08; G11C 17/18; G11C 17/16; G11C 11/40
USPC .................................................. 365/189.011
See application file for complete search history.

(56) References Cited

U.S. PATENT DOCUMENTS

| | | |
|---|---|---|
| 6,667,902 B2 | 12/2003 | Peng |
| 6,711,064 B2 | 3/2004 | Hsu |
| 7,110,278 B2 | 9/2006 | Keshavarzi |
| 7,643,328 B2 | 1/2010 | Tamura et al. |
| 9,502,114 B1 | 11/2016 | Lin |
| 10,127,993 B2 | 11/2018 | Chung |
| 10,453,846 B2 | 10/2019 | Matsuzaki et al. |
| 10,665,605 B2 | 5/2020 | Suzuki et al. |

(Continued)

FOREIGN PATENT DOCUMENTS

| | | |
|---|---|---|
| TW | 201631588 A | 9/2016 |
| TW | I669807 B | 8/2019 |
| WO | 2007046145 A1 | 4/2007 |

OTHER PUBLICATIONS

Alex Hoefler et al., "Analysis of a Novel Electrically Programmable Active Fuse for Advanced CMOS SOI One-Time Programmable Memory Applications," 2006 European Solid-State Device Research Conference, 2006 (ref. 01, only English Abstract attached).

(Continued)

*Primary Examiner* — Alexander Sofocleous
*Assistant Examiner* — James S Wells
(74) *Attorney, Agent, or Firm* — McClure, Qualey & Rodack, LLP

(57) ABSTRACT

A memory device includes a first storage transistor and a first select transistor. The first storage transistor is configured to store a first data bit. The first select transistor is configured to change the resistance of a gate of the first storage transistor, to write the first data bit into the first storage transistor, a first terminal of the first select transistor being coupled to the gate of the first storage transistor. A method of operating a memory device is also disclosed herein.

20 Claims, 10 Drawing Sheets

(56) References Cited

U.S. PATENT DOCUMENTS

| | | | |
|---|---|---|---|
| 2010/0164603 A1* | 7/2010 | Hafez | G11C 17/18 257/E29.001 |
| 2015/0062998 A1* | 3/2015 | Nam | H10B 20/25 365/96 |
| 2017/0032848 A1* | 2/2017 | Chung | G11C 17/18 |
| 2020/0051634 A1 | 2/2020 | Yavits | |
| 2020/0194668 A1 | 6/2020 | Sato | |

OTHER PUBLICATIONS

Min Shi et al., "Zero-Mask Contact Fuse for One-Time-Programmable Memory in Standard CMOS Processes," IEEE Electron Device Letters, vol. 32, 2011 (ref. 02, only English Abstract attached).

Sarvesh H. Kulkarni et al., "A 4 kb Metal-Fuse OTP-ROM Macro Featuring a 2 V Programmable 1.37μm2 1T1R Bit Cell in 32 nm High-k Metal-Gate CMOS," IEEE Journal of Solid-State Circuits, vol. 45, Issue 4, 2010 (ref. 03, only English Abstract attached).

Hyouk-Kyu Cha et al., "A High-Density 64-Bit One-Time Programmable ROM Array with 3-Transistor Cell Standard CMOS Gate-Oxide Antifuse," Journal of Semiconductor Technology and Science, vol. 4, No. 2, 2004 (ref. 04, file attached).

J. Peng et al., "A Novel Embedded OTP NVM Using Standard Foundry CMOS Logic Technology," 2006 21st IEEE Non-Volatile Semiconductor Memory Workshop, 2006 (ref. 05, only English Abstract attached).

Rick Shih-Jye Shen et al., "A high-density logic CMOS process compatible non-volatile memory for sub-28nm technologies," 2014 Symposium on VLSI Technology (VLSI-Technology): Digest of Technical Papers, 2014 (ref. 06, only English Abstract attached).

R.J. McPartland et al., "1.25 volt, low cost, embedded flash memory for low density applications," 2000 Symposium on VLSI Circuits. Digest of Technical Papers, 2000 (ref. 07, only English Abstract attached).

Chia-En Huang et al., "A Study of Self-Aligned Nitride Erasable OTP Cell by 45-nm CMOS Fully Compatible Process," IEEE Transactions on Electron Devices, vol. 56, 2009 (ref. 08, only English Abstract attached).

* cited by examiner

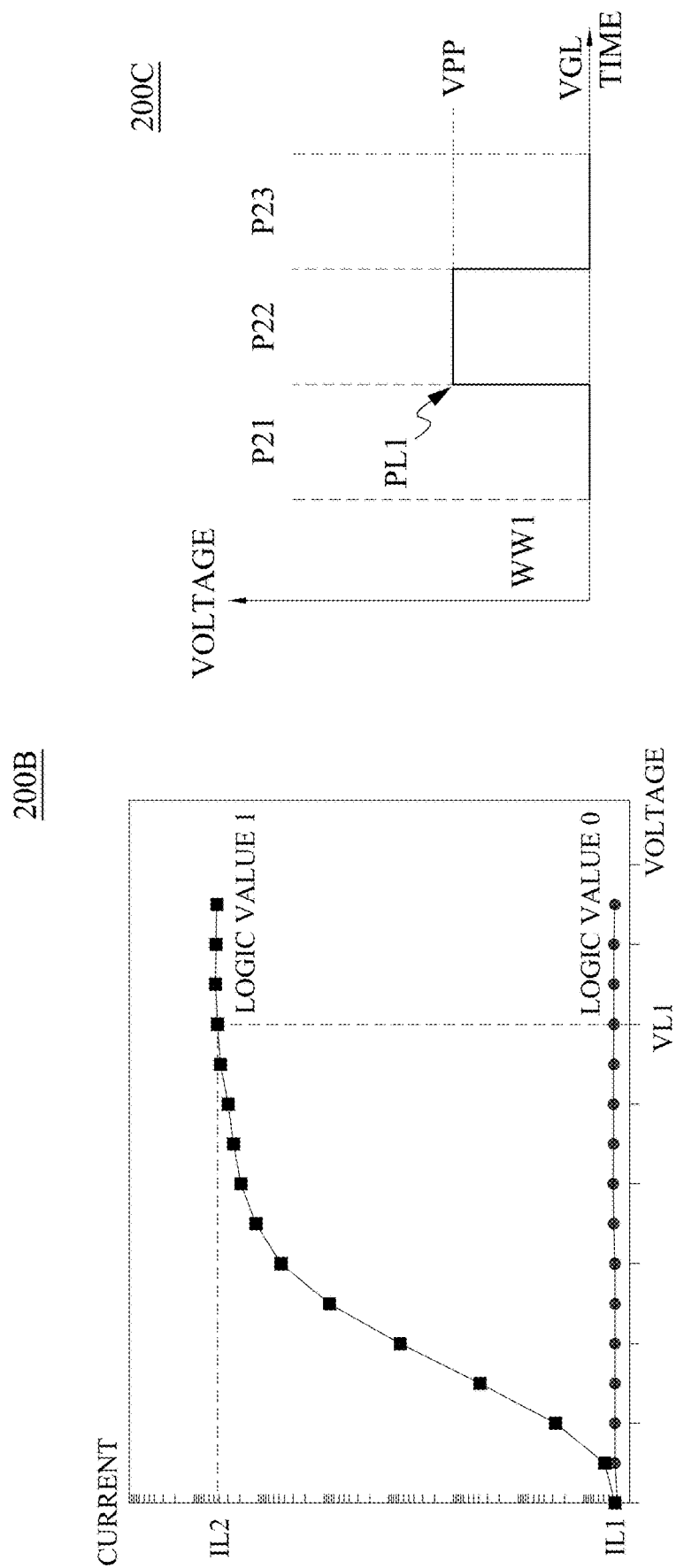

MEMORY DEVICE AND OPERATING METHOD THEREOF

CROSS-REFERENCE TO RELATED APPLICATION

This application claims priority to Taiwan Application Serial Number 111114499, filed Apr. 15, 2022, which is herein incorporated by reference in its entirety.

BACKGROUND

Technical Field

The present disclosure relates to a technology of memory. More particularly, the present disclosure relates to a memory device and an operating method of a memory device.

Description of Related Art

One time programming (OTP) memory and multi time programming (MTP) memory family have three main kinds as described below. The first kind memory is a traditional memory that metal ions in the metal connection will be moved due to electro-migration when there is a high current, thereby the metal connection is disconnected so as to form fuse-type wire memory. It can be implemented by Al/Cu/Silicide liner, poly-Si liner, contact via, or metal gate liner.

The second kind memory is that as the thickness of the gate dielectric layer is getting thinner, the electric field of the dielectric layer increases and causes hard-breakdown; and therefore, such breakdown causes the changes of gate dielectric conductivity from low to high which is called anti-fused type.

The third kind memory is using the mechanism of charge storage. For example, using memory manufacturing process to form floating-gate or silicon-oxide-nitride-oxide-silicon (SONOS) structure on a system on chip (SOC), to form a flash metal oxide semiconductor field effect transistor (MOSFET) memory; or using spacers of the poly-Si complementary metal-oxide-semiconductor (CMOS) elements to store electric charge for achieving information storage.

The first kind memory needs large area, high operation current, and its read margin is small. Therefore, the first kind memory is merely suitable for simple code programming. The second kind memory has reliability problems, causing the potential damage of the select transistor. The third kind of memory has charge loss problem, and information storage capability is poor.

In view of the above, problems and disadvantages are associated with existing products that require further improvement. Especially for the CMOS elements after the 28 nanometer technology node, associated with the development of high-k metal-gate technology, solutions of advanced-OTP memory are required.

SUMMARY

The present disclosure provides a memory device. The memory device includes a first storage transistor and a first select transistor. The first storage transistor is configured to store a first data bit. The first select transistor is configured to change the resistance of a gate of the first storage transistor, to write the first data bit into the first storage transistor, a first terminal of the first select transistor being coupled to the gate of the first storage transistor.

The present disclosure provides a method of operating a memory device. The method includes: writing a first logic value or a second logic value into a first storage transistor, including: providing a first word line signal to a gate of the first storage transistor by a first select transistor; when the first word line signal has a first voltage level corresponding to the first logic value, changing the gate of the first storage transistor to a first resistance; and when the first word line signal has a second voltage level corresponding to the second logic value, maintaining the gate of the first storage transistor at a second resistance.

The present disclosure provides a memory device. The memory device includes a first storage transistor and a first select transistor. The first storage transistor is configured to store a first data bit according to a first word line signal, a gate of the first storage transistor being configured to connect to the first word line signal. The first select transistor is configured to change a voltage level of a first terminal of the first storage transistor, to write the first data bit into the first storage transistor, a first terminal of the first select transistor being coupled to the first terminal of the first storage transistor.

It is to be understood that both the foregoing general description and the following detailed description are examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2B is a current-voltage characteristic of a current shown in FIG. 2A, illustrated according to one embodiment of the present disclosure.

FIG. 2C is a timing diagram of a word line signal shown in FIG. 2A, illustrated according to one embodiment of the present disclosure.

DETAILED DESCRIPTION

Figure 1:
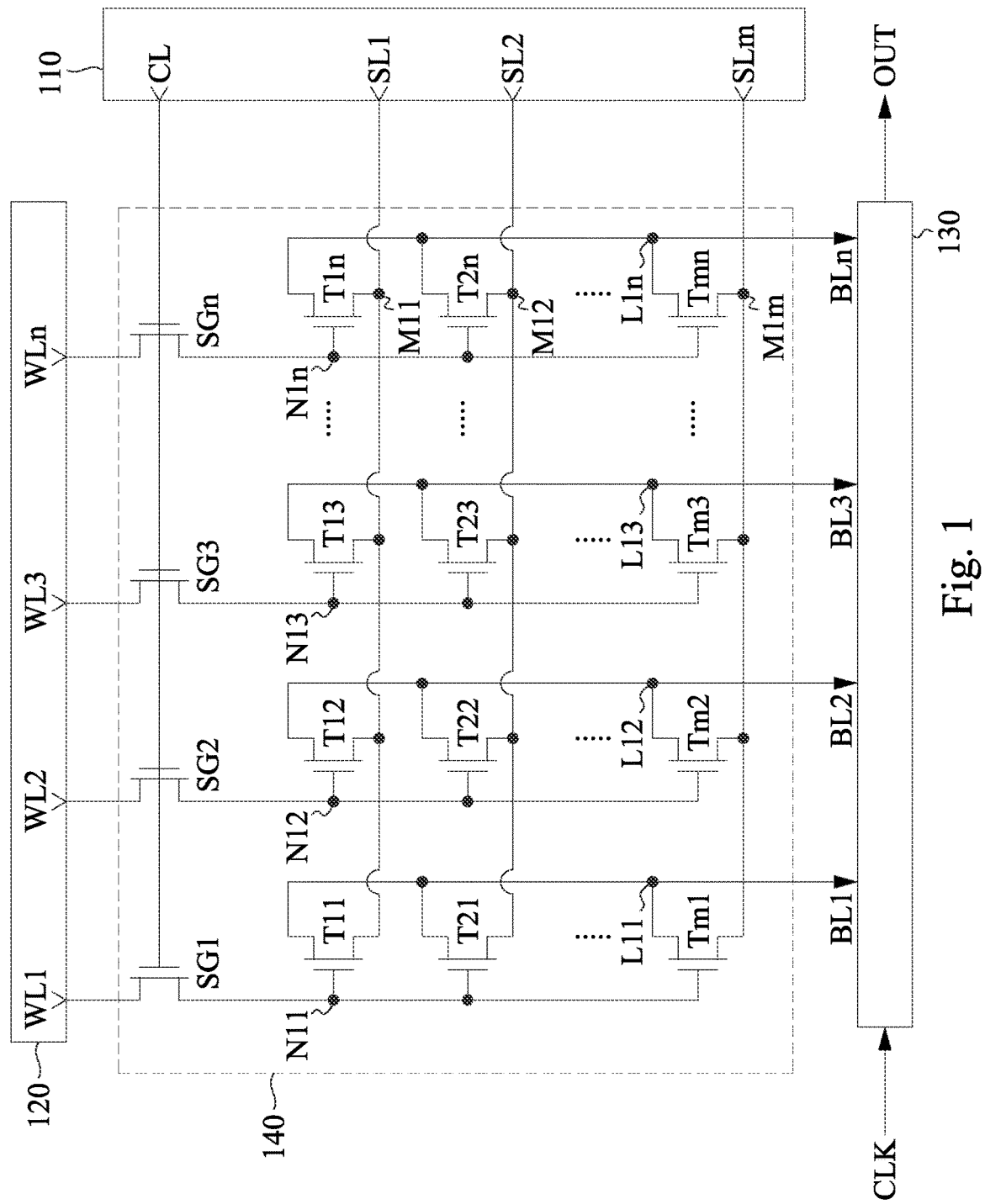
FIG. 1 is a schematic diagram of a memory illustrated according to one embodiment of the present disclosure.

In the present disclosure, when an element is referred to as "connected" or "coupled", it may mean "electrically connected" or "electrically coupled". "Connected" or "coupled" can also be used to indicate that two or more components operate or interact with each other. In addition, although the terms "first", "second", and the like are used in the present disclosure to describe different elements, the terms are used only to distinguish the elements or operations described in the same technical terms. The use of the term is not intended to be a limitation of the present disclosure.

Unless otherwise defined, all terms (including technical and scientific terms) used in the present disclosure have the same meaning as commonly understood by the ordinary skilled person to which the concept of the present invention belongs. It will be further understood that terms (such as those defined in commonly used dictionaries) should be interpreted as having a meaning consistent with its meaning in the related technology and/or the context of this specification and not it should be interpreted in an idealized or overly formal sense, unless it is clearly defined as such in this article.

The terms used in the present disclosure are only used for the purpose of describing specific embodiments and are not intended to limit the embodiments. As used in the present disclosure, the singular forms "a", "one" and "the" are also intended to include plural forms, unless the context clearly indicates otherwise. It will be further understood that when used in this specification, the terms "comprises (comprising)" and/or "includes (including)" designate the existence of stated features, steps, operations, elements and/or components, but the existence or addition of one or more other features, steps, operations, elements, components, and/or groups thereof are not excluded.

Hereinafter multiple embodiments of the present disclosure will be disclosed with schema, as clearly stated, the details in many practices it will be explained in the following description. It should be appreciated, however, that the details in these practices is not applied to limit the present disclosure. Also, it is to say, in some embodiments of the present disclosure, the details in these practices are non-essential. In addition, for the sake of simplifying schema, some known usual structures and element in the drawings by a manner of simply illustrating for it.

FIG. 1 is a schematic diagram of a memory 100 illustrated according to one embodiment of the present disclosure. In some embodiments, the memory 100 includes a select line device 110, a word line device 120, a bit line device 130 and a memory device 140. The select line device 110 is configured to provide a control signal CL and select line signals SL1-SLm to the memory device 140. The word line device 120 is configured to provide word line signals WL1-WLn to the memory device 140. It is noted that m and n at the end of the labels are positive integers. The memory device 140 is configured to store data bits, such as the data bit BT31 shown in FIG. 3A and FIG. 3B, and is configured to generate bit line signals BL1-BLn according to the stored data bits, the control signal CL, the select line signals SL1-SLm and the word line signals WL1-WLn. The bit line device 130 is configured to generate the output signal OUT according to the bit line signals BL1-BLn and a clock signal CLK. In some embodiments, the bit line device 130 includes a sense amplifier configured to control the output signal OUT.

In some embodiments, the memory device 140 includes select transistors SG1-SGn and storage transistors T11-T1$n$, T21-T2$n$, . . . , Tm1-Tmn. In some embodiments, each of the storage transistors T11-T1$n$, T21-T2$n$, . . . , Tm1-Tmn of the memory device 140 is configured for one time programming, is programmable to have fuse features, and has a gate terminal and two drain/source terminal of a transistor. Therefore, the memory device 140 is referred to as transistor fuse one time programming integrated circuit memory. In some embodiments, the select transistors SG1-SGn and the storage transistors T11-T1$n$, T21-T2$n$, . . . , Tm1-Tmn are implemented by field effect transistors.

Control terminals of the select transistors SG1-SGn are configured to connect the control signal CL. A first terminal of the select transistor SG1 is configured to connect to the word line signal WL1, a second terminal of the select transistor SG1 is coupled to control terminals of the storage transistors T11, T21, . . . , Tm1 at a node N11. A first terminal of the select transistor SG2 is configured to connect to the word line signal WL2, a second terminal of the select transistor SG2 is coupled to control terminals of the storage transistors T12, T22, . . . , Tm2 at a node N12, and so on. A first terminal of the select transistor SGn is configured to connect to the word line signal WLn, a second terminal of the select transistor SGn is coupled to control terminals of the storage transistors T1$n$, T2$n$, . . . , Tmn at a node N1$n$. In some embodiments, the first terminals of the select transistors SG1-SGn correspond to drain terminals of the select transistor SG1-SGn, the second terminals of the select transistors SG1-SGn correspond to source terminals of the select transistor SG1-SGn.

First terminals of the storage transistors T11-T1$n$ are configured to connect to the select line signal SL1 at a node M11. First terminals of the storage transistors T21-T2$n$ are configured to connect to the select line signal SL2 at a node M12, and so on. First terminals of the storage transistors Tm1-Tmn are configured to connect to the select line signal SLm at a node M1$m$.

Second terminals of the storage transistors T11, T21, . . . , Tm1 are configured to output the bit line signal BL1 at a node L11. Second terminals of the storage transistors T12, T22, . . . , Tm2 are configured to output the bit line signal BL2 at a node L12, and so on. Second terminals of the storage transistors T1$n$, T2$n$, . . . , Tmn are configured to output the bit line signal BLn at a node L1$n$. In some embodiments, the first terminals of the storage transistors T11-T1$n$, T21-T2$n$, . . . , Tm1-Tmn correspond to drain terminals of the storage transistors T11-T1$n$, T21-T2$n$, . . . , Tm1-Tmn, the second terminals of the storage transistors T11-T1$n$, T21-T2$n$, . . . , Tm1-Tmn correspond to source terminals of the storage transistors T11-T1$n$, T21-T2$n$, . . . , Tm1-Tmn.

In some approaches, in a memory device, drain/source terminals of each unit cell storage transistors are coupled to an individual drain/source terminal of a corresponding select transistor, to perform operations of reading and writing data bits. Such approaches require more elements and larger area.

Comparing to above approaches, in some embodiments of present disclosure, the drain/source terminal of the select transistor SG1 is coupled to the gate terminals of the storage transistors T11-T1$n$, such that one select transistor SG1 can control multiple storage transistors T11-T1$n$. Alternatively stated, multiple storage transistors share one select transistor. As a result, a number of required elements are reduced, and required area shrinks significantly.

Figure 2A:
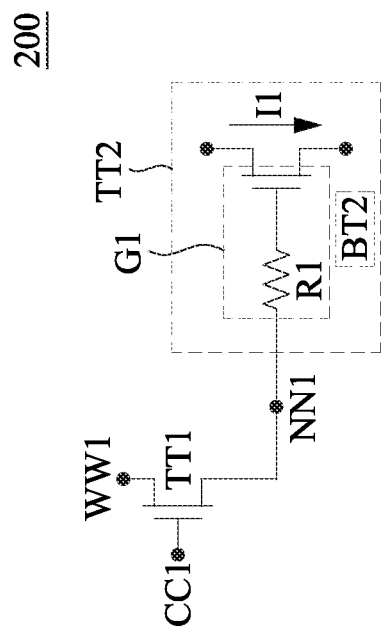
FIG. 2A is a schematic diagram of a memory device corresponding to the memory shown in FIG. 1, illustrated according to one embodiment of the present disclosure.

FIG. 2A is a schematic diagram of a memory device 200 corresponding to the memory device 140 shown in FIG. 1, illustrated according to one embodiment of the present disclosure. In some embodiments, the memory device 200 includes a select transistor TT1 and a storage transistor TT2. A control terminal of the select transistor TT1 is configured to connect to a control signal CC1, a first terminal of the select transistor TT1 is configured to connect to a word line signal WW1, a second terminal of the select transistor TT1 is coupled to a control terminal of the storage transistor TT2 at a node NN1. In some embodiments, the connection between the select transistor TT1 and the storage transistor TT2 is referred to as the cascade connection.

Referring to FIG. 2A and FIG. 1, the memory device 200 is an embodiment of the memory device 140. The select transistor TT1 corresponds to one of the select transistors SG1-SGn. The storage transistor TT2 corresponds to one of the storage transistors T11-T1$n$, T21-T2$n$, . . . , Tm1-Tmn. The node NN1 corresponds to one of the nodes N11-N1$n$. The word line signal WW1 corresponds to one of the word line signals WL1-WLn. The control signal CC1 corresponds to the control signal CL. Therefore, some descriptions are not repeated for brevity. In some embodiments, a voltage level of the control signal CC1 is approximately between 0-1.5 volt.

FIG. 2A illustrates an equivalent circuit of the storage transistor TT2. In some embodiments, the storage transistor TT2 includes a gate G1. The gate G1 corresponds to the control terminal of the storage transistor TT2. In some embodiments, the gate G1 includes a dielectric layer having a resistor R1 which has a resistance approximately equal to $10^8$ to $10^9$ ohms. In some embodiments, the select transistor TT1 is configured to provide the word line signal WW1 to the node NN1 to change the resistance of the resistor R1.

In some embodiments, the storage transistor TT2 is configured to store a data bit BT2 by the resistor R1. The storage transistor TT2 has fuse features. The fuse features is changing a first resistance of the resistor R1 of the gate G1 to a second resistance, and a current through the gate G1 becomes very small (approximately below $10^{-12}$ ampere). This is referred to as transistor fuse. For example, when the resistor R1 has the first resistance which is approximately equal to $10^8$ to $10^9$ ohms, the data bit BT2 has a first logic value, such as a logic value of 1. When the resistor R1 has the second resistance which is approximately equal to $10^{11}$ to $10^{12}$ ohms, the data bit BT2 has a second logic value, such as a logic value of 0.

In some embodiments, the storage transistor TT2 is configured to generate a current I1 according to the resistor R1. The current I1 flows through a first terminal of the storage transistor TT2 and a second terminal of the storage transistor TT2.

In some embodiments, a voltage level of the first terminal of the storage transistor TT2 is approximately below 0.1 volt, and a voltage level of the second terminal is approximately equal to 0 volt, to read the current I1.

FIG. 2B is a current-voltage characteristic 200B of the current I1 shown in FIG. 2A, illustrated according to one embodiment of the present disclosure. The current-voltage characteristic 200B includes a horizontal axis and a vertical axis.

Referring to FIG. 2B and FIG. 2A, the horizontal axis of the current-voltage characteristic 200B corresponds to a voltage level of the node NN1, the vertical axis of the current-voltage characteristic 200B corresponds to a current level of the current I1. The storage transistor TT2 is configured to provide the word line signal WW1 having a voltage level VL1 to the node NN1, such that the storage transistor TT2 operates at the voltage level VL1 to read the current I1.

In some embodiments, when the resistor R1 has the first resistance, the current I1 has a current level IL2. When the resistor R1 has the second resistance, the current I1 has a current level IL1. In some embodiments, the voltage level VL1 is approximately equal to one volt, the current level IL1 is approximately equal to $10^{-12}$ micro-amperes, and the current level IL2 is approximately equal to 1 to 100 micro-amperes.

In some embodiments, when the current I1 has the current level IL1, the data bit BT2 has the logic value of 0. When the current I1 has the current level IL2, the data bit BT2 has the logic value of 1. Referring to FIG. 2B and FIG. 1, the current I1 corresponds to one of the bit line signals BL1-BLn, and the bit line device 130 is configured to generate the output signal OUT corresponding to the logic value of the data bit BT2 according to the current level of the current I1.

FIG. 2C is a timing diagram 200C of a word line signal WW1 shown in FIG. 2A, illustrated according to one embodiment of the present disclosure. The timing diagram 200C includes periods P21-P23 arranged continuously in order.

The word line signal WW1 includes a pulse signal PL1. The pulse signal PL1 has a voltage level VGL during the periods P21 and P23, and has a voltage level VPP during the period P22. In some embodiments, the voltage level VPP is approximately equal to 3 to 6 volt, the voltage level VGL is approximately equal to 0 volt, and a time length of the period P22 is approximately between ten to one hundred nanoseconds.

In some approaches, a pulse signal applied to a storage transistor has a voltage level lower than the voltage level VPP and a time length longer than the period P22, such that the storage transistor has anti-fuse features, which cannot let the storage transistor generate two data bits of logic 0 and logic 1.

Comparing to above approaches, in some embodiments of present disclosure, the select transistor TT1 provides the pulse signal PL1 having the voltage level VPP to the storage transistor TT2, such that the storage transistor TT2 has fuse features to change the data bit BT2. As a result, the data bit BT2 can generate a data bit of logic 0 and logic 1.

Referring to FIG. 2C and FIG. 2A, before the select transistor TT1 provides the pulse signal PL1 to the gate G1, the resistor R1 has the first resistance. After the select transistor TT1 provides the pulse signal PL1 to the gate G1, the resistor R1 has the second resistance. In some embodiments, the select transistor TT1 changes nature of a dielectric layer in the gate G1 by applying the pulse signal PL1, such that the resistor R1 is changed from the first resistance to the second resistance.

In some embodiments, when the select transistor TT1 applies the word line signal WW1 having the pulse signal level VPP to the gate G1, the storage transistor TT2 has the logic value of 0. On contrary, when the select transistor TT1 applies the word line signal WW1 having the voltage level VGL to the gate G1, the storage transistor TT2 has the logic value of 1.

Figure 3A:
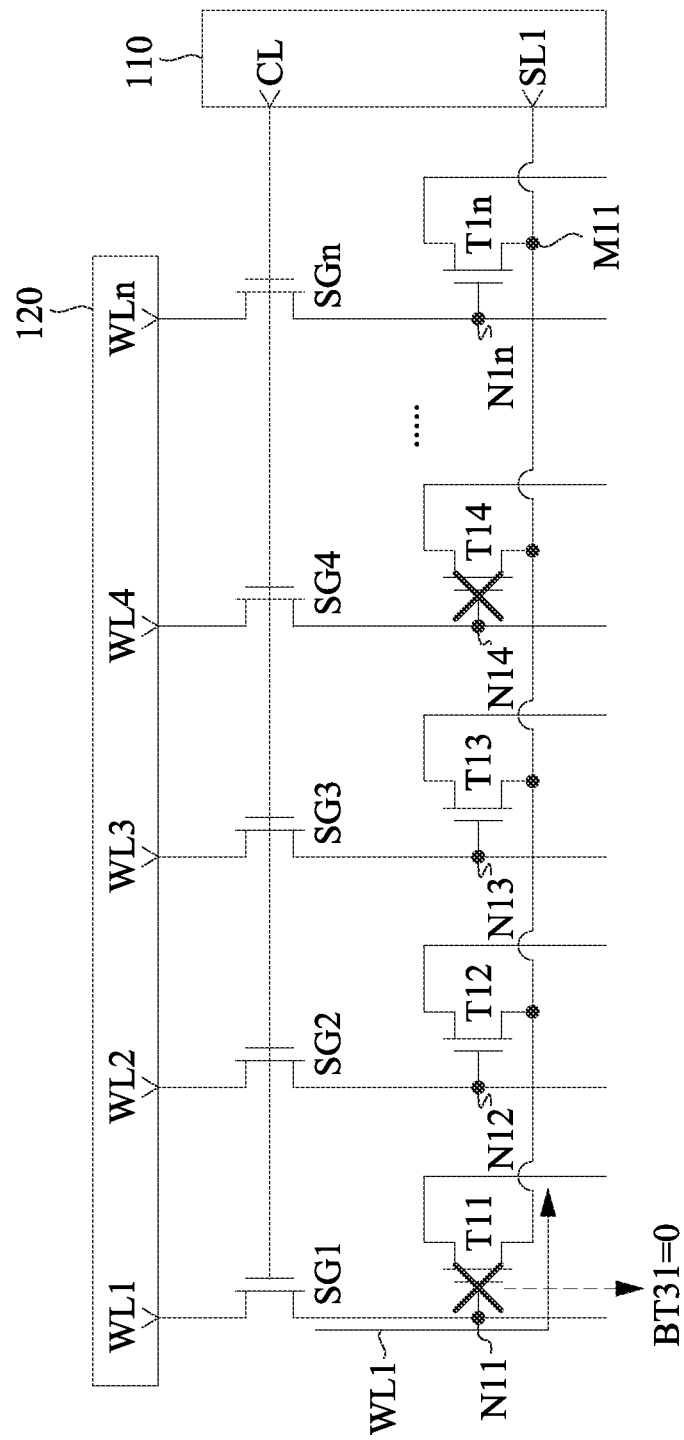
FIG. 3A is a schematic diagram of performing a write operation of logic 0 corresponding to the memory shown in FIG. 1, illustrated according to one embodiment of the present disclosure.

FIG. 3A is a schematic diagram by performing a write operation of logic 0 corresponding to the memory 100 shown in FIG. 1, illustrated according to one embodiment of the present disclosure. A portion of the memory 100 is illustrated in FIG. 3A to describe a first write operation. In this embodiment, the memory 100 is configured to perform the first write operation to write a data bit BT31 having the logic value of 0 into the storage transistor T11.

When the first write operation is performed, the control signal CL has the enable voltage level VGH, to turn on each of the select transistors SG1-SG$n$. The select line signal SL1 has the voltage level VGL, and the select line signal SL2-SL$m$ are kept floating.

The word line signal WL1-WL$n$ have voltage levels corresponding to logic values of the data bits stored in the storage transistors T11-T1$n$. A data bit stored in the storage transistor T11 has the logic value of 0. Accordingly, the word line signal WL1 has the voltage level VPP.

The word line signal WL1 flows through the select transistor SG1, a gate of the storage transistor T11 and a source of the storage transistor T11, to write the logic value of 0 into the storage transistor T11. Referring to FIG. 3A and FIG. 2C, when the first write operation is performed, the word line signal WL1 includes a pulse signal similar with the pulse signal PL1.

In some embodiments, after the first write operation is performed, the memory 100 is further configured to perform a second write operation, to write data bits into the storage transistors T21-T2$n$ of next row.

Referring to FIG. 3A and FIG. 1, the second write operation is similar with the first write operation. The storage transistors T21-T2$n$ of the second write operation correspond to the storage transistors T11-T1$n$ of the first write operation. The select line signal SL2 of the second write operation corresponds to the select line signal SL1 of the first write operation. Therefore, some descriptions are not repeated for brevity.

When the second write operation is performed, the control signal CL has the enable voltage level VGH, to turn on each of the select transistors SG1-SG$n$. The select line signal SL2 has the voltage level VGL, and the select line signal SL1 and SL3-SL$m$ are kept floating. The word line signals WL1-WL$n$ have voltage levels corresponding to logic values of the data bits stored in the storage transistors T21-T2$n$, to change the resistances of the storage transistors T21-T2$n$.

Similarly, in some embodiments, after the second write operation is performed, the memory 100 is further configured to perform a third write operation to a m'th write operation, to write data bits into the storage transistors T21-T2$n$ to T$m$1-T$mn$.

Figure 3B:
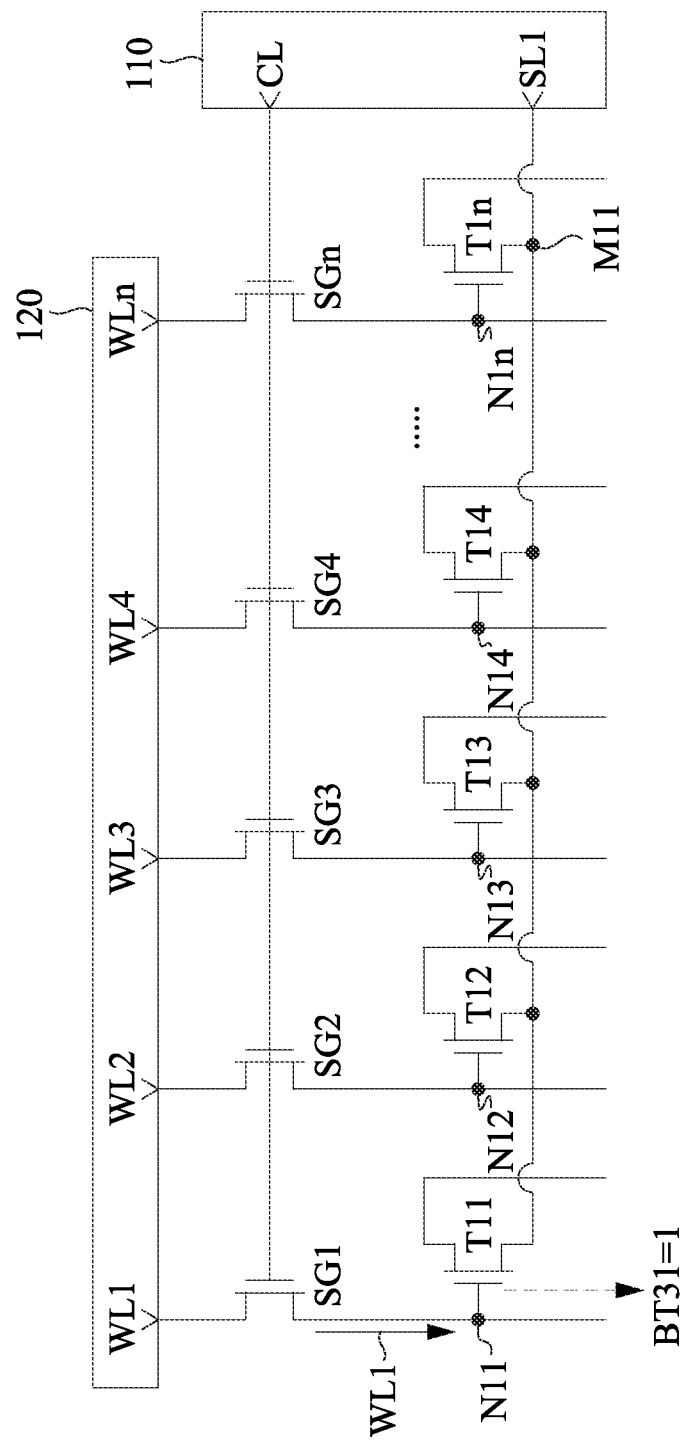
FIG. 3B is a schematic diagram of performing a write operation of logic 1 corresponding to the memory shown in FIG. 1, illustrated according to one embodiment of the present disclosure.

FIG. 3B is a schematic diagram of performing a first write operation of logic 1 corresponding to the memory 100 shown in FIG. 1, illustrated according to one embodiment of the present disclosure. A portion of the memory 100 is illustrated in FIG. 3B to describe the first write operation. In this embodiment, the memory 100 is configured to perform the first write operation to write the data bit BT31 having the logic value of 1 into the storage transistor T11.

When the first write operation is performed, the word line signals WL1-WL$n$ have voltage levels corresponding to logic values of the data bits stored in the storage transistors T11-T1$n$. A data bit stored in the storage transistor T11 has the logic value of 1. Accordingly, the word line signal WL1 has the voltage level VGL.

The word line signal WL1 flows through the select transistor SG1 to a gate of the storage transistor T11, and does not change a gate resistance of the storage transistor T11, such that the storage transistor T11 is maintained at the logic value of 1. When the first write operation is performed, the word line signal WL1 does not include a pulse signal.

Figure 3C:
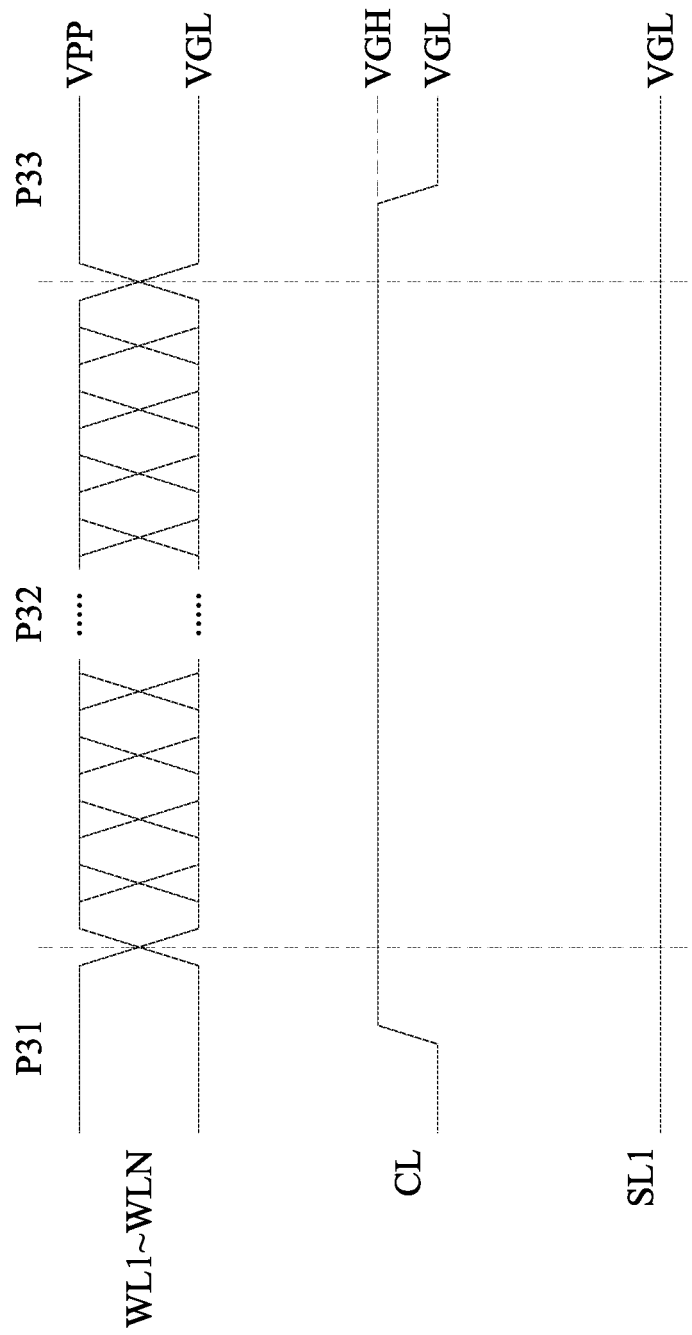
FIG. 3C is a timing diagram corresponding to the write operations shown in FIG. 3A and FIG. 3B, illustrated according to one embodiment of the present disclosure.

FIG. 3C is a timing diagram 300C corresponding to the first write operations shown in FIG. 3A and FIG. 3B, illustrated according to one embodiment of the present disclosure. The timing diagram 300C includes periods P31-P33 arranged continuously in order.

Referring to FIG. 3A to FIG. 3C, the first write operation corresponds to operations during the period P32. During the period P32, the control signal CL has the enable voltage level VGH, the select line signal SL1 has the voltage level VGL, and the word line signals WL1-WL$n$ have voltage levels VPP or VGL corresponding to logic values of the data bits stored in the storage transistors T11-T1$n$.

During the period P32, the control signal CL has the voltage level VGL, the select line signal SL1 has the voltage level VGL. A time length of the control signal CL having the enable voltage level VGH is longer than a time length of the period P32.

Figure 4A:
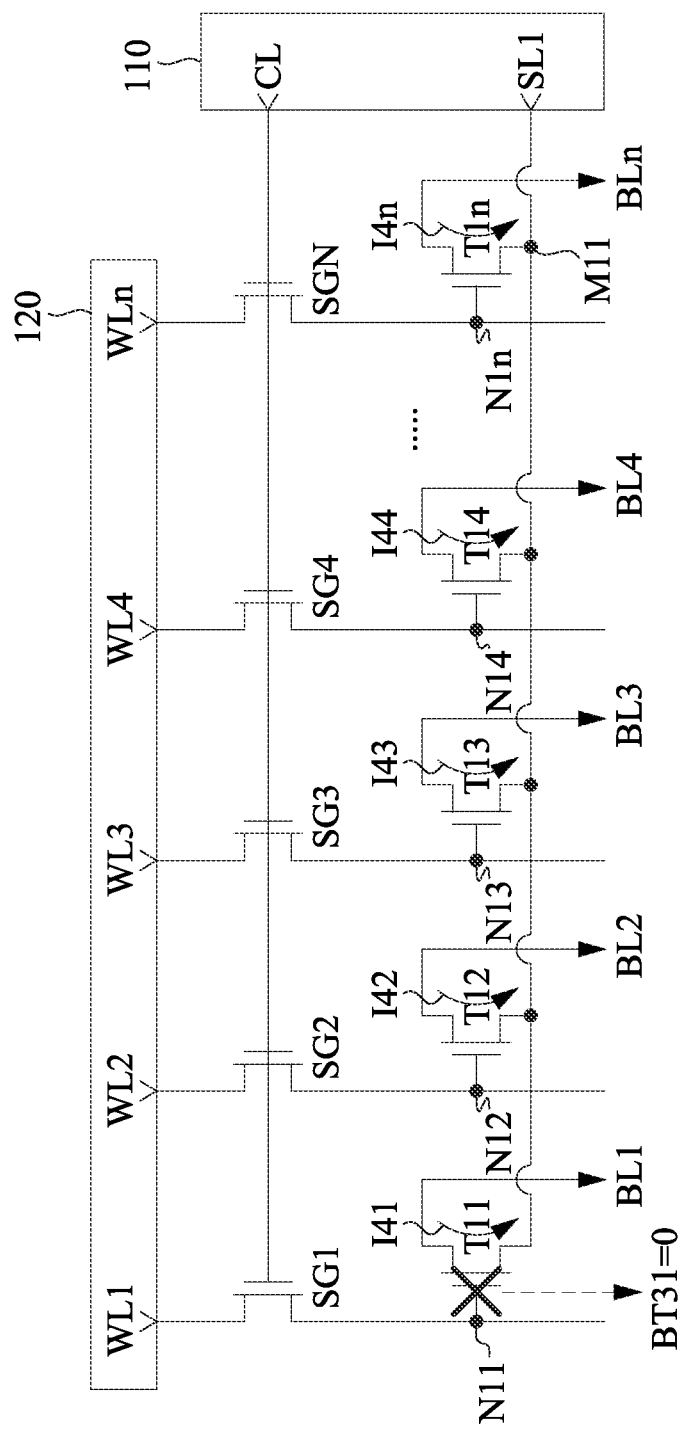
FIG. 4A is a schematic diagram of performing a read operation of logic 0 corresponding to the memory shown in FIG. 1, illustrated according to one embodiment of the present disclosure.

FIG. 4A is a schematic diagram of performing a first read operation of logic 0 corresponding to the memory 100 shown in FIG. 1, illustrated according to one embodiment of the present disclosure. In some embodiments, the memory 100 is configured to perform the first read operation to read the data bit BT31 from the storage transistor T11. A portion of the memory 100 is illustrated in FIG. 4A to describe the first read operation. In some embodiments, the first read operation is performed after the first write operation, to read the data bits written into the storage transistors T11-T1$n$ during the first write operation.

When the first read operation is performed, the control signal CL has the enable voltage level VGH, to turn on each of the select transistors SG1-SG$n$, such that the select transistors SG1-SG$n$ provides the word line signals WL1-WL$n$ to the nodes N11-N1$n$. The word line signals WL1-WL$n$ have the enable voltage level VGH, such that the storage transistors T11-T1$n$ are turned on.

The select line signal SL1 has the voltage level VGL, such that the storage transistors T11-T1$n$ generate current signals I41-I4$n$, respectively. The current signals I41-I4$n$ correspond to the logic values of the data bits stored in the storage transistors T11-T1$n$, respectively. In the embodiment shown in FIG. 4A, the data bit BT31 has the logic value of 0, the current signal I41 has the current level IL1 shown in FIG. 2B.

In some embodiments, when the first read operation is performed, the select line signals SL2-SL$n$ have float voltage levels, such that the storage transistors T21-T2$n$, T31-T3$n$, . . . , T$m$1-T$mn$ do not affect the reading of the storage transistors T11-T1$n$.

The current signal I41 flows through the drain of the storage transistor T11 and the source of the storage transistor T11, to generate corresponding bit line signal BL1, and so on. The current signal I42-I4$n$ are drain to source currents of the storage transistors T12-T1$n$, respectively, to generate corresponding bit line signals BL2-BL$n$.

When the first read operation is performed, the bit line device 130 is configured to generate the output signal OUT corresponding to the current signal I42-I4$n$ according to the bit line signals BL1-BL$n$.

In some embodiments, after the first read operation is performed, the memory device is further configured to perform a second read operation, to read data bits stored in the storage transistors T21-T2$n$ of the next row.

The second read operation is similar with the first read operation. The storage transistors T21-T2$n$ of the second read operation correspond to the storage transistors T11-T1$n$ of the first read operation. The select line signal SL2 of the second read operation corresponds to the select line signal SL1 of the first read operation. Therefore, some descriptions are not repeated for brevity.

When the second read operation is performed, the control signal CL and the word line signals WL1-WLn have the enable voltage level VGH, to turn on each of the select transistors SG1-SGn. The select line signal SL2 has the voltage level VGL, and the select line signals SL1 and SL3-SLm have float voltage levels.

Similarly, in some embodiments, after the second read operation is performed, the memory 100 is further configured to perform a third read operation to a m'th read operation, to read data bits from the storage transistors T21-T2n to Tm1-Tmn.

Figure 4B:
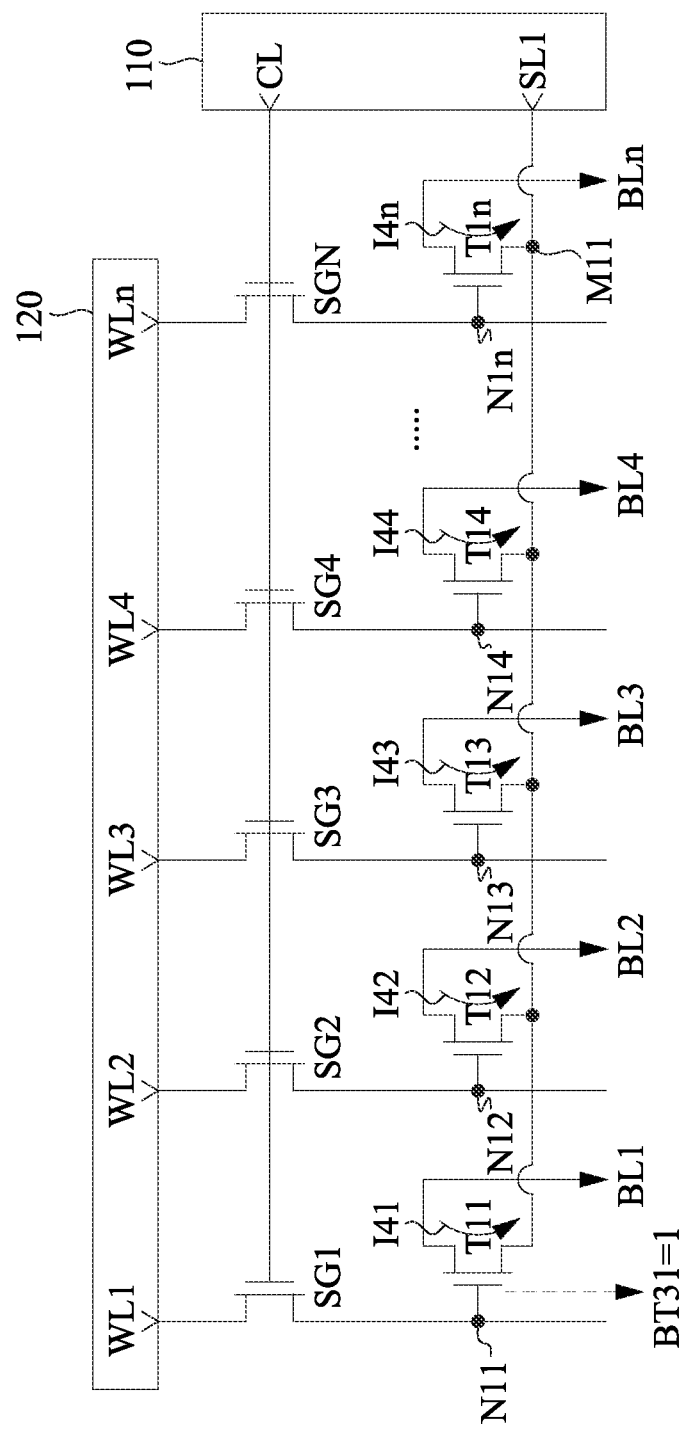
FIG. 4B is a schematic diagram of performing a read operation of logic 1 corresponding to the memory shown in FIG. 1, illustrated according to one embodiment of the present disclosure.

FIG. 4B is a schematic diagram of performing a first read operation of logic 1 corresponding to the memory 100 shown in FIG. 1, illustrated according to one embodiment of the present disclosure. A portion of the memory 100 is illustrated in FIG. 4B to describe the first read operation. In the embodiment shown in FIG. 4B, the data bit BT31 has the logic value of 1, the current signal I41 has the current level IL2 shown in FIG. 2B.

Figure 4C:
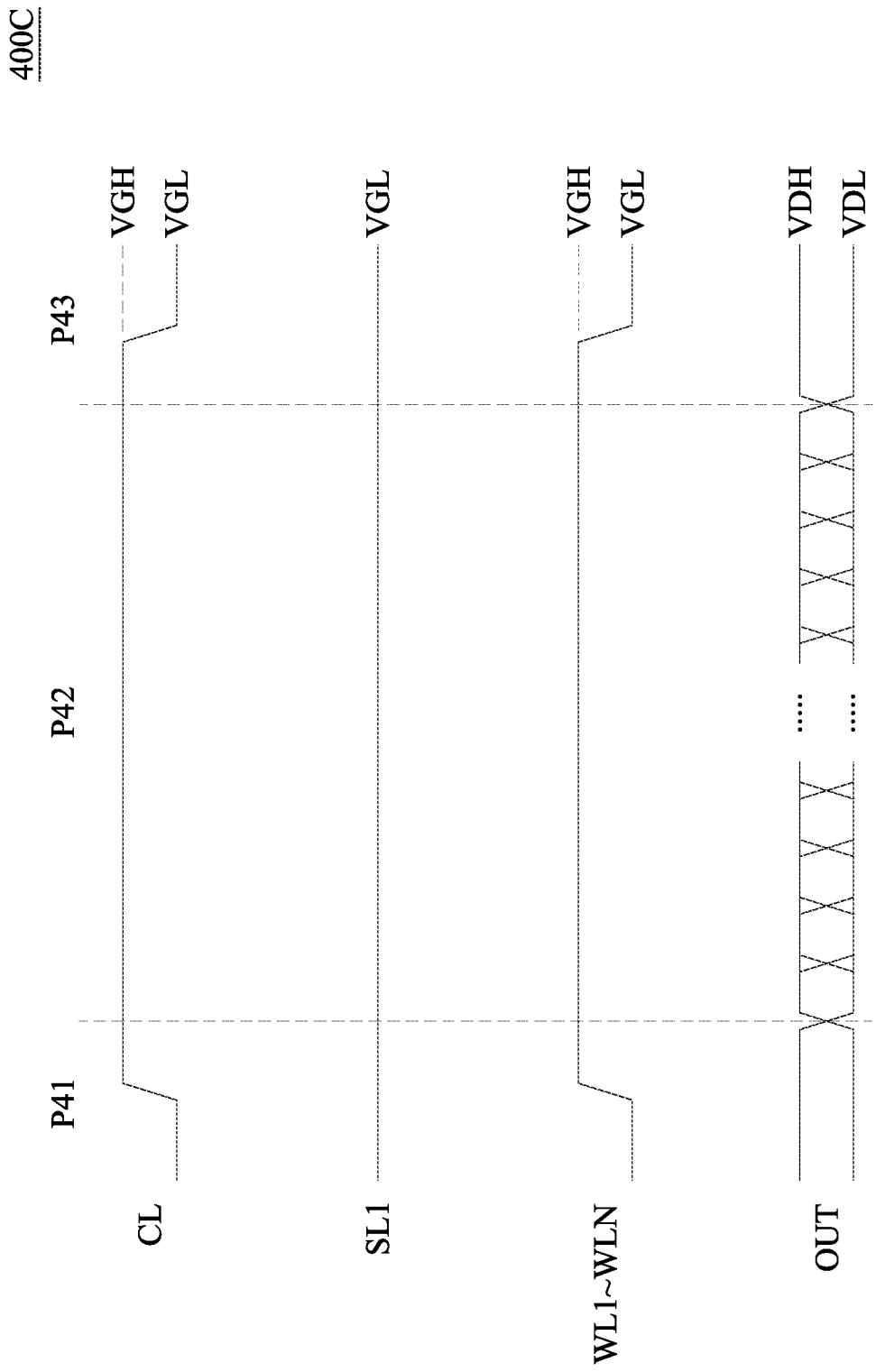
FIG. 4C is a timing diagram corresponding to the read operations shown in FIG. 4A and FIG. 4B, illustrated according to one embodiment of the present disclosure.

FIG. 4C is a timing diagram 400C corresponding to the first read operations shown in FIG. 4A and FIG. 4B, illustrated according to one embodiment of the present disclosure. The timing diagram 400C includes periods P41-P43 arranged continuously in order.

The first read operation corresponds to operations during the period P42. During the period P42, the control signal CL has the enable voltage level VGH, the select line signal SL1 has the voltage level VGL, the word line WL1-WLn have the enable voltage level VGH, and the output signal OUT has the voltage levels corresponding to the logic values of the data bits stored on the storage transistors T11-T1n.

For example, when the storage transistor T11 has the first logic value, during a period corresponding to the storage transistor T11 in the period P42, the output signal OUT has a voltage level VDH. When the storage transistor T11 has the second logic value, during the period corresponding to the storage transistor T11 in the period P42, the output signal OUT has a voltage level VDL.

During the periods P41 and P43, the control signal CL, the select line signal SL1 and the word line WL1-WLn have the voltage level VGL, and the output signal OUT does not have the voltage levels corresponding to the logic values of the data bits stored on the storage transistors T11-T1n. A time length of the control signal CL and the word line WL1-WLn have the enable voltage level VGH is longer than a time length of the period P42.

Figure 5:
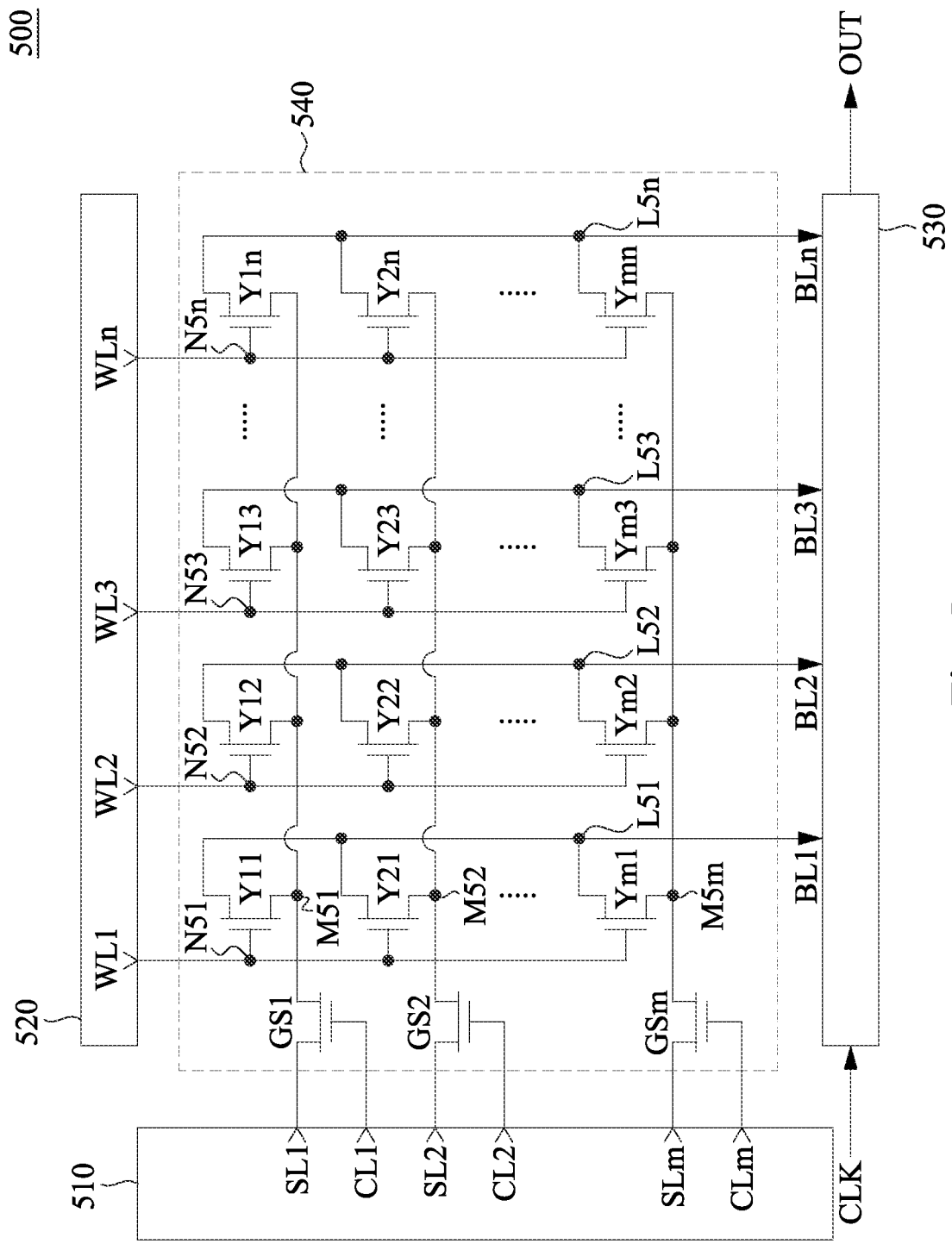
FIG. 5 is a schematic diagram of a memory illustrated according to one embodiment of the present disclosure.

FIG. 5 is a schematic diagram of a memory 500 illustrated according to one embodiment of the present disclosure. In some embodiments, the memory 500 includes a select line device 510, a word line device 520, a bit line device 530 and a memory device 540. The select line device 510 is configured to provide control signal CL1-CLm and the select line signals SL1-SLm to the memory device 540. The word line device 520 is configured to provide the word line signals WL1-WLn to the memory device 540. The memory device 540 is configured to store data bits, and is configured to generate bit line signals BL1-BLn according to stored data bits, the control signals CL1-CLm, the select line signals SL1-SLm and the word line signals WL1-WLn. The bit line device 530 is configured to generate the output signal OUT according to the bit line signals BL1-BLn and a clock signal CLK.

Referring to FIG. 1 and FIG. 5, the memory 500 is an alternative embodiment of the memory 100. Operations and configurations of the select line device 510, the word line device 520, the bit line device 530 and the memory device 540 are similar with the operations and configurations of the select line device 110, the word line device 120, the bit line device 130 and the memory device 140.

In some embodiments, the memory device 540 includes select transistors GS1-GSm and storage transistors Y11-Y1n, Y21-Y2n, ..., Ym1-Ymn. Operations and configurations of the select transistors GS1-GSm and the storage transistors Y11-Y1n, Y21-Y2n, ..., Ym1-Ymn are similar with operations and configurations of the select transistors SG1-SGn and the storage transistors T11-T1n, T21-T2n, ..., Tm1-Tmn, respectively. Therefore, some descriptions are not repeated for brevity.

Control terminals of the select transistors GS1-GSm are configured to connect the control signals CL1-CLm, respectively. A first terminal of the select transistor GS1 is configured to connect to the select line signal SL1, a second terminal of the select transistor GS1 is coupled to first terminals of the storage transistors Y11-Y1n at a node M51. A first terminal of the select transistor GS2 is configured to connect to the select line signal SL2, a second terminal of the select transistor GS2 is coupled to control terminals of the storage transistors Y21-Y2n at a node M52, and so on. A first terminal of the select transistor GSm is configured to connect to the select line signal SLm, a second terminal of the select transistor GSm is coupled to control terminals of the storage transistors Ym1-Ymn at a node M5m.

Control terminals of the storage transistors Y11, Y21, ..., Ym1 are configured to connect to the word line signal WL1 at a node N51. Control terminals of the storage transistors Y12, Y22, ..., Ym2 are configured to connect to the word line signal WL2 at a node N52, and so on. Control terminals of the storage transistors Y1n, Y2n, ..., Ymn are configured to connect to the word line signal WLn at a node N5n.

Second terminals of the storage transistors Y11, Y21, ..., Ym1 are configured to output the bit line signal BL1 at a node L51. Second terminals of the storage transistors Y12, Y22, ..., Ym2 are configured to output the bit line signal BL2 at a node L52, and so on. Second terminals of the storage transistors Y1n, Y2n, ..., Ymn are configured to output the bit line signal BLn at a node L5n.

In some embodiments, the memory 500 is configured to perform the first write operation described in FIG. 3A to FIG. 3C and the first read operation described in FIG. 4A to FIG. 4C.

When the first write operation is performed, the word line signal WL1-WLn have a voltage level VPP or VGL corresponding to the logic value of 0 or the logic value of 1. The control signal CL1 has the enable voltage level VGH, such that the select transistor GS1 is turned on. At this moment, the select transistor GS1 provides the select line signal SL1 having the voltage level VGL to the node M51, such that resistance of gates of the storage transistors Y11-Y1n are changed according to the word line signal WL1-WLn. Alternatively stated, the select transistor GS1 is configured to change the voltage level of the node M51, to write the data bits into the storage transistors Y11-Y1n by the word line signal WL1-WLn.

For example, when the first write operation is performed, when the word line signal WL1 has the voltage level VGL, the resistance of the gate of the storage transistor Y11 is maintained at the first resistance. Accordingly, the data bit stored in the storage transistor Y11 has the logic value of 1. When the word line signal WL1 has the voltage level VPP, the resistance of the gate of the storage transistor Y11 is changed to the second resistance. Accordingly, the data bit stored in the storage transistor Y11 has the logic value of 0.

For another example, when the first write operation is performed, when the word line signal WL2 has the voltage level VGL, the resistance of the gate of the storage transistor Y12 is maintained at the first resistance. Accordingly, the data bit stored in the storage transistor Y12 has the logic value of 1. When the word line signal WL2 has the voltage level VPP, the resistance of the gate of the storage transistor Y12 is changed to the second resistance. Accordingly, the data bit stored in the storage transistor Y12 has the logic value of 0.

In some embodiments, after the first write operation is performed, the memory 500 is further configured to perform the second write operation, to write the data bits into the storage transistors Y21-Y2n of the next row.

When the second write operation is performed, the word line signal WL1-WLn have a voltage level VPP or VGL corresponding to the logic value of 0 or the logic value of 1. The control signal CL2 has the enable voltage level VGH, such that the select transistor GS2 is turned on. At this moment, the select transistor GS2 provides the select line signal SL2 having the voltage level VGL to the node M52, such that resistance of gates of the storage transistors Y21-Y2n are changed according to the word line signal WL1-WLn. Alternatively stated, the select transistor GS2 is configured to change the voltage level of the node M52, to write the data bits into the storage transistors Y21-Y2n by the word line signal WL1-WLn.

For example, during the second write operation, when the word line signal WL1 has the voltage level VGL, the resistance of the gate of the storage transistor Y21 is maintained at the first resistance. Accordingly, the data bit stored in the storage transistor Y21 has the logic value of 1. When the word line signal WL1 has the voltage level VPP, the resistance of the gate of the storage transistor Y21 is changed to the second resistance. Accordingly, the data bit stored in the storage transistor Y21 has the logic value of 0.

For another example, during the second write operation, when the word line signal WL2 has the voltage level VGL, the resistance of the gate of the storage transistor Y22 is maintained at the first resistance. Accordingly, the data bit stored in the storage transistor Y22 has the logic value of 1. When the word line signal WL2 has the voltage level VPP, the resistance of the gate of the storage transistor Y22 is changed to the second resistance. Accordingly, the data bit stored in the storage transistor Y22 has the logic value of 0.

Similarly, in some embodiments, after the second write operation is performed, the memory 500 is further configured to perform the third write operation to the m'th write operation, to write the data bits into the storage transistors Y31-Y3n to Ym1-Ymn.

In some embodiments, after the first write operation is performed, the memory 500 is further configured to perform the first read operation, to read the data bits written into the storage transistors Y11-Y1n during to first write operation.

When the first read operation is performed, the control signal CL1 has the enable voltage level VGH, to turn on the select transistor GS1, such that the select transistor SG1 provides the select line signal SL1 having the voltage level VGL to the node M51. At this moment, the word line signals WL1-WLn have the enable voltage level VGH, such that the transistors Y11-Y1n are turned on. The transistors Y11-Y1n generate the bit line signals BL1-BLn according to the logic values of the data bits stored in the transistors Y11-Y1n.

For example, during the first read operation, when the storage transistor Y11 has the first resistance corresponding to the logic value of 1, the bit line signal BL1 has the current level IL2. When the storage transistor Y11 has the second resistance corresponding to the logic value of 0, the bit line signal BL1 has the current level IL1.

For another example, during the first read operation, when the storage transistor Y12 has the first resistance corresponding to the logic value of 1, the bit line signal BL2 has the current level IL2. When the storage transistor Y12 has the second resistance corresponding to the logic value of 0, the bit line signal BL2 has the current level IL1.

In some embodiments, after the first read operation is performed, the memory 500 is further configured to perform the second read operation, to read the data bits stored in the storage transistors Y21-Y2n of the next row.

When the second read operation is performed, the control signal CL2 has the enable voltage level VGH, to turn on the select transistor GS2, such that the select transistor SG2 provides the select line signal SL2 having the voltage level VGL to the node M52. At this moment, the word line signals WL1-WLn have the enable voltage level VGH, such that the transistors Y21-Y2n are turned on. The transistors Y21-Y2n generate the bit line signals BL1-BLn according to the logic values of the data bits stored in the transistors Y21-Y2n.

For example, during the second read operation, when the storage transistor Y21 has the first resistance corresponding to the logic value of 1, the bit line signal BL1 has the current level IL2. When the storage transistor Y21 has the second resistance corresponding to the logic value of 0, the bit line signal BL1 has the current level IL1.

For another example, during the second read operation, when the storage transistor Y22 has the first resistance corresponding to the logic value of 1, the bit line signal BL2 has the current level IL2. When the storage transistor Y22 has the second resistance corresponding to the logic value of 0, the bit line signal BL2 has the current level IL1.

Similarly, in some embodiments, after the second read operation is performed, the memory 500 is further configured to perform the third read operation to the m'th read operation, to read the data bits stored in the storage transistors Y31-Y3n to Ym1-Ymn.

Although the present disclosure has been described in considerable detail with reference to certain embodiments thereof, other embodiments are possible. Therefore, the spirit and scope of the appended claims should not be limited to the description of the embodiments contained in the present disclosure.

It will be apparent to those skilled in the art that various modifications and variations can be made to the structure of the present disclosure without departing from the scope or spirit of the disclosure. In view of the foregoing, it is intended that the present disclosure cover modifications and variations of the present disclosure provided they fall within the scope of the following claims.

What is claimed is:

1. A memory device, comprising:
a first storage transistor configured to store a first data bit; and
a first select transistor configured to change a resistance of a gate of the first storage transistor, to write the first data bit into the first storage transistor, a first terminal of the first select transistor being coupled to the gate of the first storage transistor,
wherein a first terminal of the first storage transistor is configured to output a bit line signal, and a second terminal of the first storage transistor is configured to connect to a select line signal different from the bit line signal.

2. The memory device of claim 1, wherein the first select transistor is further configured to provide a first word line signal to the gate of the first storage transistor, and
when the first data bit is written into the first storage transistor, the first word line signal flows through the gate of the first storage transistor and the second terminal of the first storage transistor.

3. The memory device of claim 2, wherein
when the first data bit is written into the first storage transistor and the first word line signal has a first current level, the gate of the first storage transistor is maintained at a first resistance, and
when the first data bit is written into the first storage transistor and the first word line signal has a second current level larger than the first current level, the gate of the first storage transistor is changed to a second resistance larger than the first resistance.

4. The memory device of claim 2, wherein the first storage transistor is configured to generate a first current corresponding to the first data bit, and
the first current flows through the second terminal of the first storage transistor and the first terminal of the first storage transistor.

5. The memory device of claim 1, further comprising:
a second storage transistor configured to store a second data bit, a first terminal of the second storage transistor being coupled to the first terminal of the first storage transistor,
wherein the first select transistor is further configured to change a resistance of a gate of the second storage transistor, to write the second data bit into the second storage transistor, the first terminal of the first select transistor being coupled to the gate of the second storage transistor.

6. The memory device of claim 5, further comprising:
a third storage transistor configured to store a third data bit, a first terminal of the third storage transistor being coupled to the second terminal of the first storage transistor; and
a second select transistor configured to be turned on when the first select transistor is turned on, and configured to change a resistance of a gate of the third storage transistor, to write the third data bit into the third storage transistor, a first terminal of the second select transistor being coupled to the gate of the third storage transistor.

7. The memory device of claim 1, wherein the first select transistor is further configured to provide a pulse signal to the gate of the first storage transistor.

8. A method of operating a memory device, comprising:
writing a first logic value or a second logic value into a first storage transistor, comprising:
providing a first word line signal to a gate of the first storage transistor by a first select transistor;
when the first word line signal has a first voltage level corresponding to the first logic value, changing the gate of the first storage transistor to a first resistance; and
when the first word line signal has a second voltage level corresponding to the second logic value, maintaining the gate of the first storage transistor at a second resistance,
wherein a first terminal of the first storage transistor is configured to output a bit line signal, and a second terminal of the first storage transistor is configured to connect to a select line signal different from the bit line signal.

9. The method of claim 8, further comprising:
after writing the first logic value or the second logic value into the first storage transistor, writing the first logic value or the second logic value into a second storage transistor, comprising:
providing the first word line signal to a gate of the second storage transistor by the first select transistor;
when the first word line signal has the first voltage level, changing the gate of the second storage transistor to the first resistance; and
when the first word line signal has the second voltage level, maintaining the gate of the second storage transistor at the second resistance,
wherein a first terminal of the second storage transistor is coupled to the first terminal of the first storage transistor.

10. The method of claim 9, further comprising:
during writing the first logic value or the second logic value into the first storage transistor, writing the first logic value or the second logic value into a third storage transistor, comprising:
providing a second word line signal to a gate of the third storage transistor by a second select transistor;
when the second word line signal has the first voltage level, changing the gate of the third storage transistor to the first resistance; and
when the second word line signal has the second voltage level, maintaining the gate of the third storage transistor at the second resistance,
wherein a first terminal of the third storage transistor is coupled to the second terminal of the first storage transistor.

11. The method of claim 8, further comprising:
after writing the first logic value or the second logic value into the first storage transistor, reading the first logic value or the second logic value stored in the first storage transistor, comprising:
generating a first current by the first storage transistor,
wherein when the first storage transistor has the first logic value, the first current has a first current level, and
when the first storage transistor has the second logic value, the first current has a second current level different from the first current level.

12. The method of claim 11, further comprising:
during reading the first logic value or the second logic value stored in the first storage transistor, reading the first logic value or the second logic value stored in a second storage transistor, comprising:
generating a second current by the second storage transistor,
wherein the second terminal of the first storage transistor is coupled to a first terminal of the second storage transistor,
the first current flows through the first terminal of the first storage transistor and the second terminal of the first storage transistor, and
the second current flows through the first terminal of the second storage transistor and a second terminal of the second storage transistor.

13. The method of claim 12, further comprising:
after reading the first logic value or the second logic value stored in the first storage transistor, reading the first logic value or the second logic value stored in a third storage transistor, comprising:
generating a third current by the third storage transistor, wherein the first terminal of the first storage transistor is coupled to a first terminal of the third storage transistor, and a control terminal of the first storage transistor is coupled to a control terminal of the third storage transistor.

14. A memory device, comprising:
a first storage transistor configured to store a first data bit according to a first word line signal, a gate of the first storage transistor being configured to connect to the first word line signal; and
a first select transistor configured to change a voltage level of a first terminal of the first storage transistor, to write the first data bit into the first storage transistor, a first terminal of the first select transistor being coupled to the first terminal of the first storage transistor,
wherein a second terminal of the first storage transistor is configured to output a bit line signal, and the first terminal of the first storage transistor is configured to receive a select line signal different from the bit line signal.

15. The memory device of claim 14, wherein when the first data bit is written into the first storage transistor, the first word line signal flows through the gate of the first storage transistor and the first terminal of the first storage transistor.

16. The memory device of claim 14, wherein
when the first data bit is written into the first storage transistor and the first word line signal has a first current level, the gate of the first storage transistor is maintained at a first resistance, and
when the first data bit is written into the first storage transistor and the first word line signal has a second current level larger than the first current level, the gate of the first storage transistor is changed to a second resistance larger than the first resistance.

17. The memory device of claim 14, wherein the first storage transistor is configured to generate a first current corresponding to the first data bit, and
the first current flows through the second terminal of the first storage transistor and the first terminal of the first storage transistor.

18. The memory device of claim 14, further comprising:
a second storage transistor configured to store a second data bit according to a second word line signal, a gate of the second storage transistor being configured to connect to the second word line signal, a first terminal of the second storage transistor being coupled to the first terminal of the first storage transistor,
wherein the first select transistor is further configured to change a voltage level of the first terminal of the second storage transistor, to write the second data bit into the second storage transistor.

19. The memory device of claim 18, further comprising:
a third storage transistor configured to store a third data bit according to the first word line signal, a gate of the third storage transistor being configured to connect to the first word line signal; and
a second select transistor configured to change a voltage level of a first terminal of the third storage transistor, to write the third data bit into the third storage transistor, a first terminal of the second select transistor being coupled to the first terminal of the second storage transistor.

20. The memory device of claim 19, wherein a second terminal of the third storage transistor is coupled to the second terminal of the first storage transistor, and
the first select transistor and the second select transistor are turned on in order.

* * * * *